US011233493B2

(12) United States Patent
Timme et al.

(10) Patent No.: US 11,233,493 B2
(45) Date of Patent: Jan. 25, 2022

(54) METHOD FOR FABRICATING RESONATOR STRUCTURE AND RESONATOR STRUCTURE

(71) Applicant: Infineon Technologies AG, Neubiberg (DE)

(72) Inventors: Hans-Joerg Timme, Ottobrunn (DE); Carsten Ahrens, Regensburg (DE); Ruediger Bauder, Feldkirchen-Westerham (DE)

(73) Assignee: Infineon Technologies AG, Neubiberg (DE)

( * ) Notice: Subject to any disclaimer, the term of this patent is extended or adjusted under 35 U.S.C. 154(b) by 918 days.

(21) Appl. No.: 15/934,387

(22) Filed: Mar. 23, 2018

(65) Prior Publication Data

US 2018/0294790 A1 Oct. 11, 2018

(30) Foreign Application Priority Data

Apr. 6, 2017 (DE) .......................... 102017107391.4

(51) Int. Cl.
| H03H 3/02 | (2006.01) |
| H03H 9/205 | (2006.01) |
| H03H 9/17 | (2006.01) |
| H01L 41/277 | (2013.01) |
| H03H 9/58 | (2006.01) |
| H03H 9/02 | (2006.01) |

(52) U.S. Cl.
CPC ............. *H03H 3/02* (2013.01); *H01L 41/277* (2013.01); *H03H 9/175* (2013.01); *H03H 9/205* (2013.01); *H03H 9/584* (2013.01); *H03H 9/589* (2013.01); *H03H 2003/025* (2013.01); *H03H 2009/02188* (2013.01)

(58) Field of Classification Search
CPC .......... H03H 3/02; H03H 9/178; H03H 9/205; H03H 9/584; H03H 9/589; H03H 2003/025; H03H 2009/02188; H01L 41/277
USPC ....................................................... 29/25.35
See application file for complete search history.

(56) References Cited

U.S. PATENT DOCUMENTS

| 2009/0265903 A1 | 10/2009 | Handtmann et al. |
| 2014/0354115 A1 | 12/2014 | Burak et al. |
| 2015/0365069 A1* | 12/2015 | Durner .................. H03H 9/605 333/131 |

(Continued)

FOREIGN PATENT DOCUMENTS

| CN | 1531721 A | 9/2004 |
| CN | 1929303 A | 3/2007 |
| CN | 101213645 A | 7/2008 |

(Continued)

OTHER PUBLICATIONS

Liu et al., "Materials, Design, and Characteristics of Bulk Acoustic Wave Resonator: A Review", published in the journal of micro machines, 2020, 11, 630; doi:10.3390/mi11070630 (Year: 2020).*

(Continued)

*Primary Examiner* — Robert J Pascal
*Assistant Examiner* — Hafizur Rahman
(74) *Attorney, Agent, or Firm* — Schiff Hardin LLP (57) ABSTRACT

Methods for manufacturing resonator structures and corresponding resonator structures are described. A first wafer including a first piezoelectric material is singulated and bonded to a second wafer.

17 Claims, 10 Drawing Sheets

(56) References Cited

U.S. PATENT DOCUMENTS

2017/0148765 A1* 5/2017 Yu .......................... H01L 21/78
2021/0218386 A1* 7/2021 Yusuf .................. H03H 9/0095

FOREIGN PATENT DOCUMENTS

CN       102282764 A    12/2011
DE       10315239 A1    10/2004

OTHER PUBLICATIONS

German Patent Office, Office Action issued for DE 102017107391.4, 6 pgs., dated Dec. 18, 2017.
Office Action dated Jun. 3, 2021 for Chinese Patent Application No. 201810301958.2.

* cited by examiner

METHOD FOR FABRICATING RESONATOR STRUCTURE AND RESONATOR STRUCTURE

TECHNICAL FIELD

The present application relates to methods for manufacturing resonator structures and to corresponding resonator structures.

BACKGROUND

Filters are used in a variety of electronic circuits to filter out certain frequency components of a signal while letting other frequency components pass. For example, in communication circuits, filters may be used to block frequency components outside a frequency band or part of a frequency band used for communication and to be processed by further circuits.

To increase bandwidth, communication standards like wireless communication standards (for example LTE, Long Term Evolution) or also wire-based communication standards continually increase a used frequency range and a number of used frequency bands. In communication devices implementing such standards, often highly selective filters matching to the respective frequency bands are required. The frequency bands used may differ from country to country. Therefore, a plurality of filters having different filter characteristics (for example different passbands) are required. Furthermore, in what is referred to as carrier aggregation several frequency bands are operated at the same time. This requires specific filter designs for exactly those combinations. With a specific filter provided for each possible combination, the number of physical filters is actually much higher than the number of available bands. In order to reduce the number of different filters (2-port up to n-port filters) actually required in a communication device, tunable filters are highly desirable.

As highly selective bandpass filters in communication circuits and devices, surface acoustic wave (SAW) or bulk acoustic wave (BAW) technologies are frequently used. Conventional filters of such types are designed for fixed resonance or center frequencies. As a consequence, many filters are required to serve individual frequency bands or aggregated combinations of several frequency bands used in current communication standards like LTE or WiFi standards. Radio frequency (RF) switches are then used to select individual filters of the plurality of filters for example for desired signal paths between an antenna, a low noise amplifier or power amplifier. As such conventional approaches require a large number of mostly discrete components and as space is limited in mobile devices, tunable solutions are highly desirable.

One approach to provide tunability to BAW filters is to use coupled resonators with a first resonator and a second resonator, where the second resonator serves as the actual filter resonator and the first resonator, which is acoustically coupled to the second resonator, serves for tuning, for example by adjusting tunable capacitors coupled therewith. In some applications, different materials are desired for the first and second resonators. For example, for the second resonator, in many applications, a small resonator bandwidth is desired to provide small-band filters, while the second resonator should provide a large tuning range, which requirements may be implemented using different materials. However, such different materials may be difficult to integrate in a manufacturing process, for example due to different wafer sizes available and/or due to different material properties.

SUMMARY

A method as defined in claim 1 or 6 and a resonator structure as defined in claim 19 are provided. The dependent claims define further embodiments.

According to an embodiment, a method for manufacturing a coupled resonator structure is provided, comprising:

processing a first wafer to form a processed first wafer, the processed first wafer comprising a first piezoelectric material, processing a second wafer to form a processed second wafer, the processed second wafer comprising a second piezoelectric material, singulating the first wafer to form at least one singulated wafer chip, bonding the at least one singulated wafer chip to the second wafer to form a joint wafer, and processing the joint wafer to form a resonator structure comprising a first resonator including the first piezoelectric material and a second resonator including the second piezoelectric material such that the first and second resonators are acoustically coupled with each other.

According to another embodiment, a method for manufacturing a resonator structure is provided, comprising:

processing a first wafer to form a processed first wafer, the processed first wafer comprising a first piezoelectric material, processing a second wafer to form a processed second wafer, the processed second wafer comprising an acoustic termination at a first side thereof, singulating the first wafer to form at least one singulated wafer chip, bonding the at least one singulated wafer chip to the second wafer such that the first side of the second wafer faces the singulated wafer chip to form a joint wafer, and processing the joint wafer to form a resonator structure comprising a first resonator including the first piezoelectric material.

According to another embodiment, a resonator structure is provided, comprising:

a diced first wafer piece comprising a first piezoelectric material, a substrate comprising an acoustic termination at a first side thereof, wherein the diced wafer piece is bonded to the second wafer such that the first side faces the diced wafer piece.

The above summary is merely intended to give a brief overview over some implementations and is not to be construed as limiting.

DETAILED DESCRIPTION

In the following, various embodiments will be described in detail referring to the attached drawings. It should be noted that these embodiments serve illustrative purposes only and are not to be construed as limiting. For example, while embodiments may be described as comprising a plurality of features, elements or details, in other embodiments, some of these features, elements or details may be omitted and/or may be replaced by alternative features, elements or details. In addition to the features, elements or details explicitly described or shown in the drawings, other features, elements or details, for example components conventionally used in bulk acoustic wave (BAW) resonators or BAW-based filters, may be provided.

Features from different embodiments may be combined to form further embodiments unless noted to the contrary. Variations or modifications described with respect to one of the embodiments may also be applicable to other embodiments unless noted otherwise.

Embodiments discussed in the following relate to manufacturing of bulk acoustic wave (BAW) resonator structures, which may be used to build a BAW-based filter. For forming acoustic resonators like BAW resonators, generally a piezoelectric layer is provided between two electrodes (e.g. top and bottom electrodes), and acoustic waves propagate through the bulk of the piezoelectric material. The application of an electric field between the two electrodes generates a mechanical stress that is further propagated through the bulk of the structure as an acoustic wave. A resonance condition is established when the acoustical path in thickness direction of the structure corresponds to integer multiples of half the acoustic wave length.

In embodiments, at least two resonators are used which are acoustically coupled to each other to form a resonator structure. The at least two resonators comprise a first resonator using a first piezoelectric material and a second resonator using a second piezoelectric material. In some embodiments, the first piezoelectric material is provided as or on a first wafer, which is processed, diced and then provided to a second wafer. This way, by first dicing the first wafer and then providing the diced portions (also referred to as chips herein) to the second wafer enables the use of different materials which are provided in different wafer sizes.

For example, embodiments used herein may be used to integrate a thin lithium niobate (LiNbO3) crystal film into such a coupled resonator structures, for example based on silicon wafers. LiNbO3 crystals are usually available as wafers having a diameter of about 100 mm, while silicon (Si) wafers are available in larger sizes, for example as 200 mm or even 300 mm wafers. Using larger wafers for building resonator structures in many applications is preferable, as it enables parallel processing of more structures on a single wafer and may therefore serve to increase production yield. By using techniques disclosed herein, e.g. 100 mm LiNbO3 wafers may be used to form resonator structures on larger Si wafers like 200 mm wafers or 300 mm wafers. While LiNbO3 is used as an example material herein, other materials may also be used, for example lithium tantalate (LiTaO3).

Figure 1:
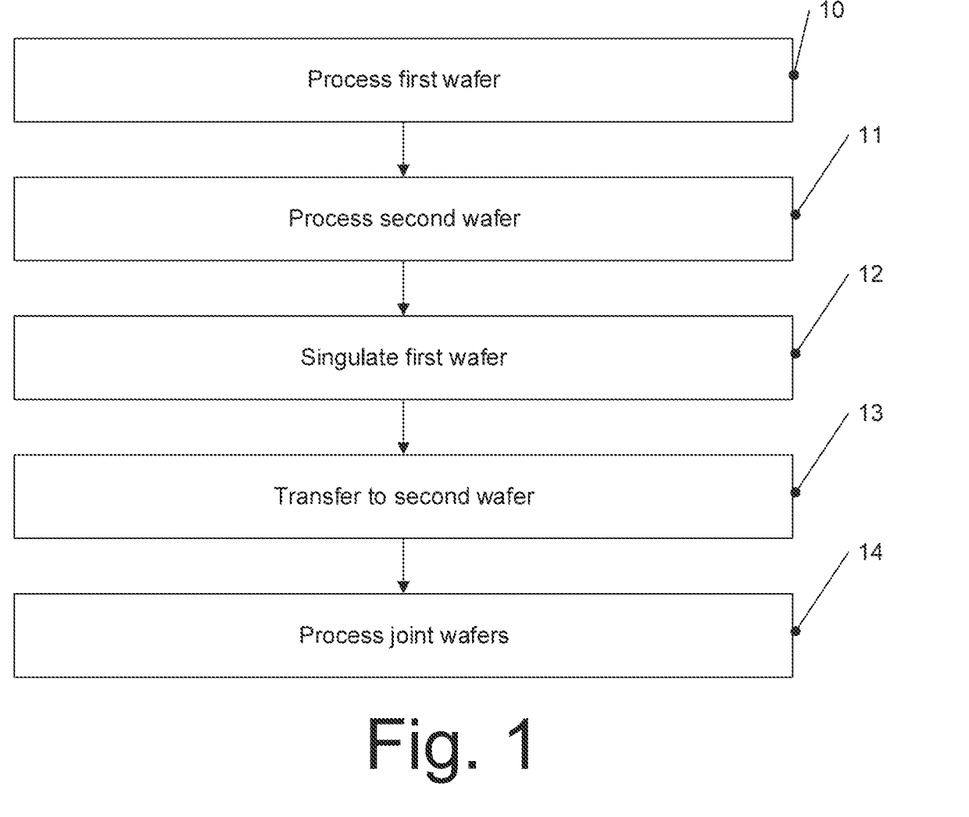
FIG. 1 is a flowchart illustrating a method according to an embodiment.

Turning now to the figures, FIG. 1 is a flowchart of a method for manufacturing a resonator structure according to some embodiments. While the method of FIG. 1 is depicted as a series of acts or events, the order in which the events are described is not to be construed as limiting. For example, some acts or events may be performed in different orders, or some acts or events may be performed simultaneously. Examples of such varying orders will be given when describing the method of FIG. 1.

At 10, the method of FIG. 1 comprises providing a first wafer. The first wafer may be made of a piezoelectric material, for example of monocrystalline piezoelectric material like lithium niobate (LiNbO3), intended as piezoelectric material for a first resonator of a coupled resonator structure. In other embodiments, the first wafer may be a wafer carrying a first piezoelectric material. Processing the first wafer may for example include providing an electrode, for example by metal deposition.

At 11, the method comprises processing a second wafer. The second wafer in some embodiments may be a semiconductor wafer, and processing the second wafer may comprise forming a resonator comprising a second piezoelectric material on the second wafer. In some embodiments, the second wafer is a silicon wafer, and processing the second wafer may comprise depositing for example aluminum nitride as second piezoelectric material on the second wafer, and/or may comprise forming electrodes or other components of the second resonator.

At 12, the method comprises singulating the first wafer, also referred to as dicing, i.e. cutting individual pieces (also referred to as chips, chip dies or dies) from the first wafer, each piece being intended for one or more individual resonator structures. In other words, each piece may have a size to comprise one or more structures intended for one or more resonators structures in a final device.

It should be noted that the acts described with reference to numeral 10-12 may also be performed in a different order. For example, the second wafer may be processed prior to processing the first wafer, or may be processed in parallel to processing and/or singulating the first wafer.

At 13, the pieces singulated at 12 are transferred to the second wafer and bonded to the second wafer. It should be noted that pieces from more than one first wafer may be transferred to a single second wafer, for example to use a larger area of the second wafer for device manufacturing compared to an area of the first wafer. For example, in some implementations, the first wafer may be a LiNbO3 wafer, with sizes typically up to 100 mm diameter, while the second wafer may be a silicon wafer having a diameter of 200 mm or 300 mm.

At 14, the method then comprises processing of the joint wafers (second wafer with singulated pieces of first wafer bonded thereto) to finalize resonator structures.

Figure 2:
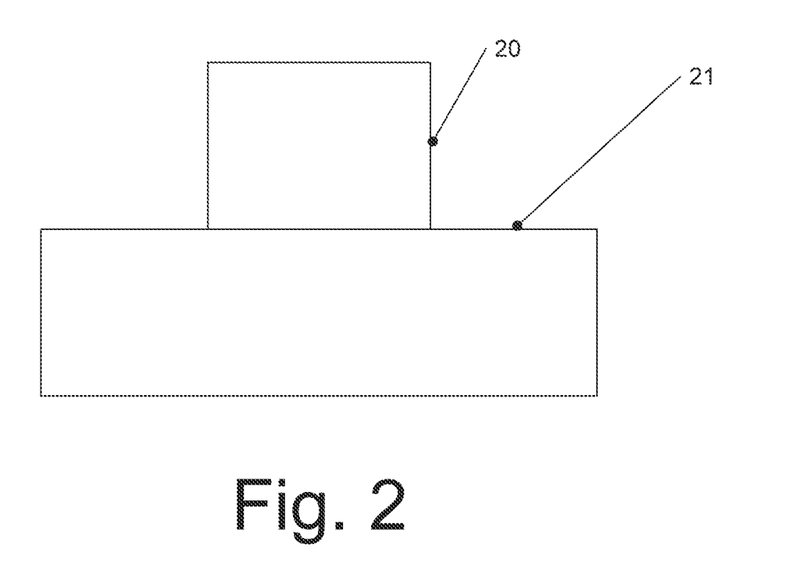
FIG. 2 is a schematic cross-sectional view illustrating a device according to an embodiment.

FIG. 2, in a simplified way, illustrates a resonator device according to an embodiment. The resonator device of FIG. 2 comprises a portion 20 based on a singulated piece of a first wafer, comprising a first piezoelectric material, bonded to a second portion 21 based on a second wafer, with a second piezoelectric material for forming a second resonator. The first and second resonators are acoustically coupled in the device of FIG. 2, and for example a first resonator including the first piezoelectric material may serve for tuning the resonator structure, while a second resonator including the second piezoelectric material is the resonator directly incorporated (for example by connecting its electrodes) in a filter device.

Next, a more specific example for the general method and device described with reference to FIGS. 1 and 2 will be given referring to FIGS. 3 and 4.

Figure 3:
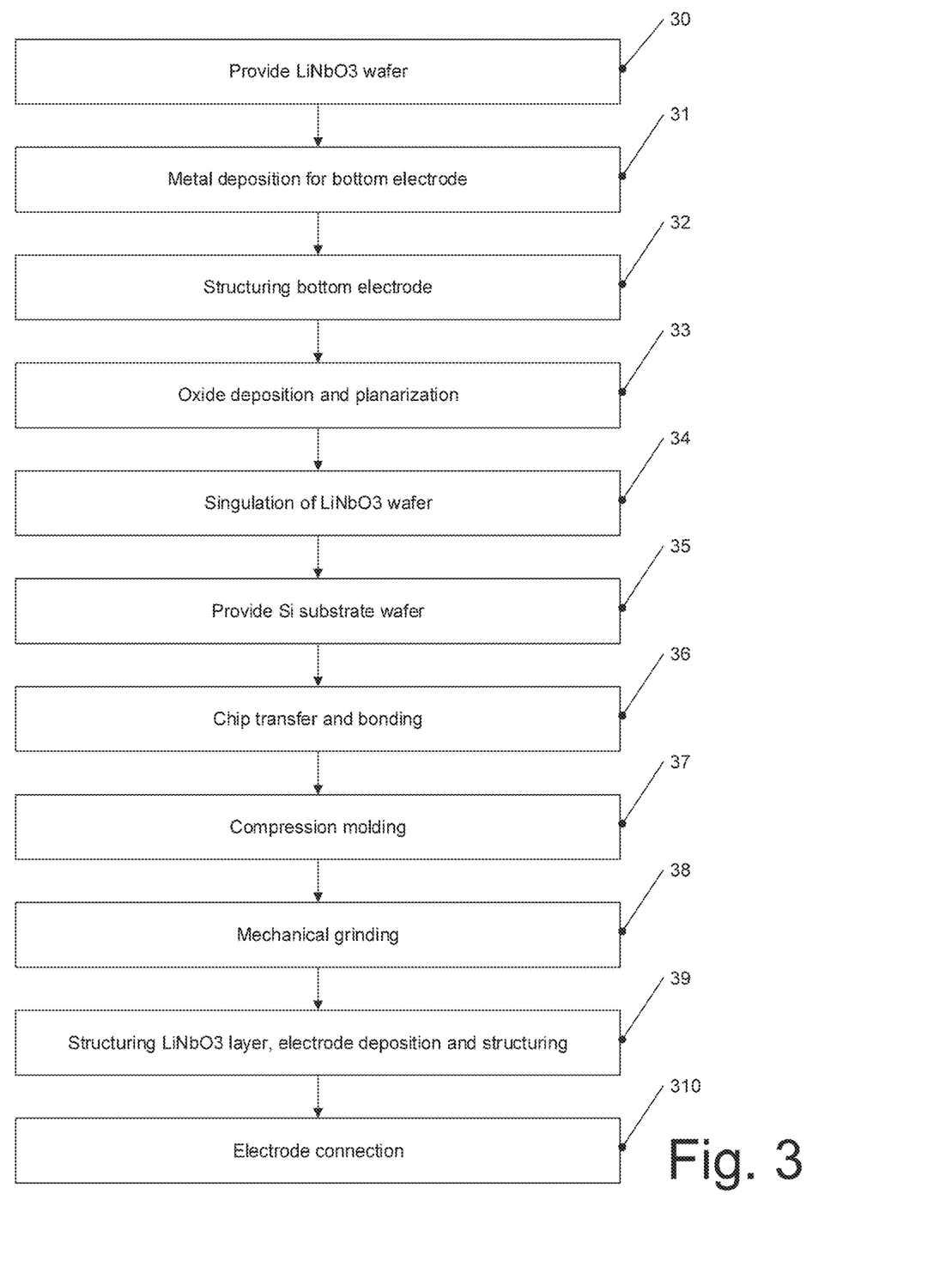
FIG. 3 is a flowchart illustrating a method according to an embodiment.

FIG. 3 is a flowchart illustrating a detailed method for manufacturing a resonator structure according to an embodiment. FIGS. 4A-4M illustrate the resonator structure in various stages of the manufacturing process. The specific example of FIGS. 3 and 4 is given for further illustrating the general method and device discussed with reference to FIGS. 1 and 2, but is not to be construed as limiting. In particular, while specific materials and structures are given in FIGS. 3 and 4 for illustration purposes, other materials and structures may also be used. While in FIG. 3 a plurality of acts or events are shown, in other embodiments some of the acts or events may be omitted, depending on a particular processing used and a particular resonator structure to be manufactured.

Figure 4A:
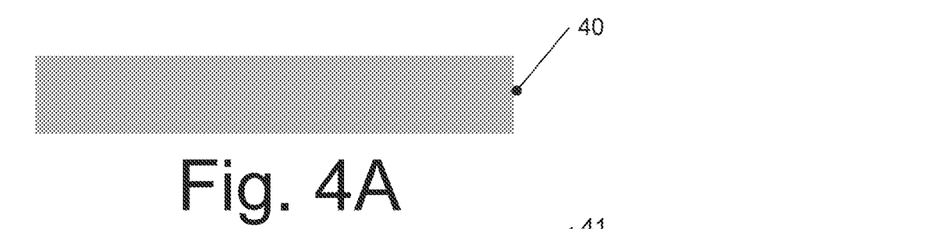
FIGS. 4A to 4M are cross-sectional views of a device in various stages of processing according to some embodiments.

At 30 of FIG. 3, the method comprises providing a lithium niobate (LiNbO3) wafer, which is shown as a LiNbO3 wafer 40 in FIG. 4A. LiNbO3 wafer 40 may for example be a 100 mm diameter wafer, but is not limited to this wafer size. Such LiNbO3 wafers are commercially available.

Figure 4B:
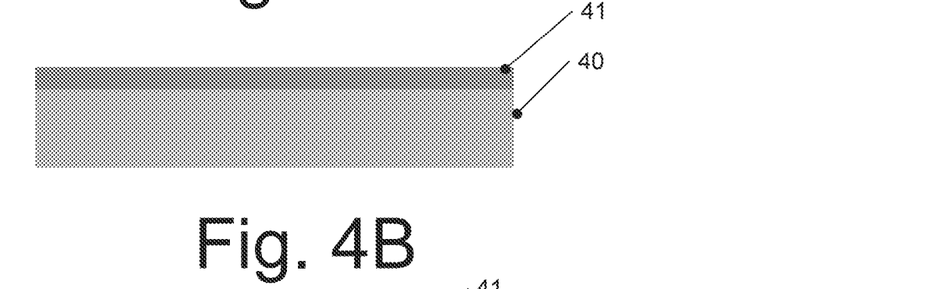

At 31, the method comprises depositing a metal layer as a conductive material on the LiNbO3 wafer, which metal layer will later form a bottom electrode of a first resonator. In FIG. 4B, as an example a metal layer 41 is shown provided on LiNbO3 wafer 40. Any conventional metal deposition techniques like sputtering may be used. Usable metals include tungsten or aluminum, but are not limited thereto. Combinations of metals or sandwich electrodes made of different metals are also possible as conductive material.

Figure 4C:
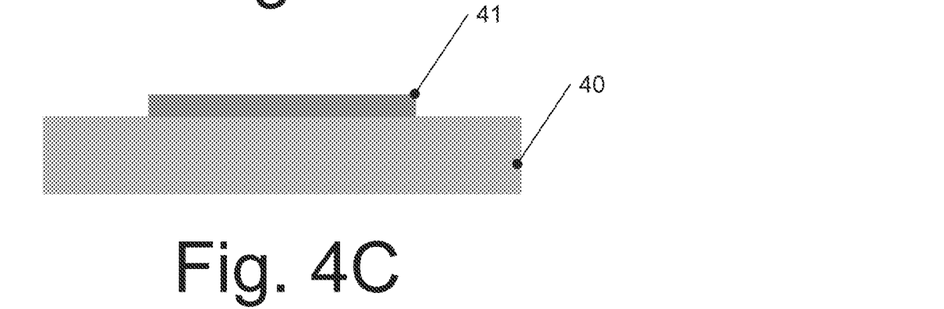

At 32, optionally the method of FIG. 3 comprises structuring the bottom electrode, for example defining a size for the electrode. An example is shown in FIG. 4C, where metal layer 41 is structured to form an electrode of a certain size. Any conventional metal structuring technique may be used, for example lithography techniques in combination with dry (plasma) or wet etch processes.

Figure 4D:
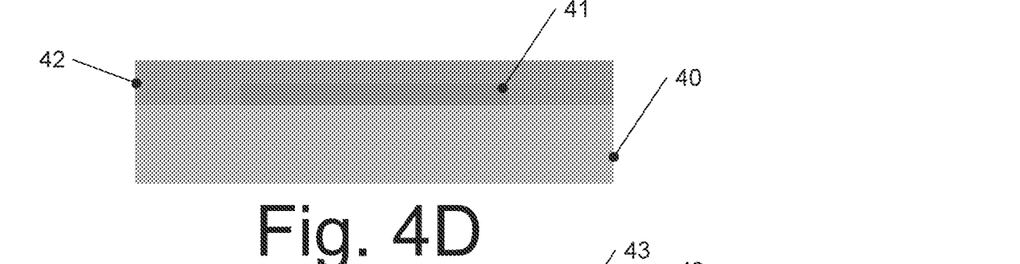

At 33, the method comprises deposition an oxide (or other isolation layer) on the LiNbO3 wafer, and subsequently planarizing the oxide. An example for a suitable oxide is silicon dioxide. The planarization may for example be performed by a standard CMP process (chemical mechanical polishing). An example result of the planarization is illustrated in FIG. 4D, where an oxide layer covers LiNbO3 wafer 40 and metal layer 41, the oxide layer 42 having a planar surface (immediately after deposition, the steps between metal layer 41 and LiNbO3 wafer 40 would at least partially be reflected in the surface of oxide layer 42).

It should be noted that FIGS. 4A-4C show only a portion of wafer 40, and in mass production of resonator devices a plurality of electrodes may be formed from metal layer 41 intended for a plurality of resonator structures, of which only a single electrode is shown in FIGS. 4A-4C.

Figure 4E:
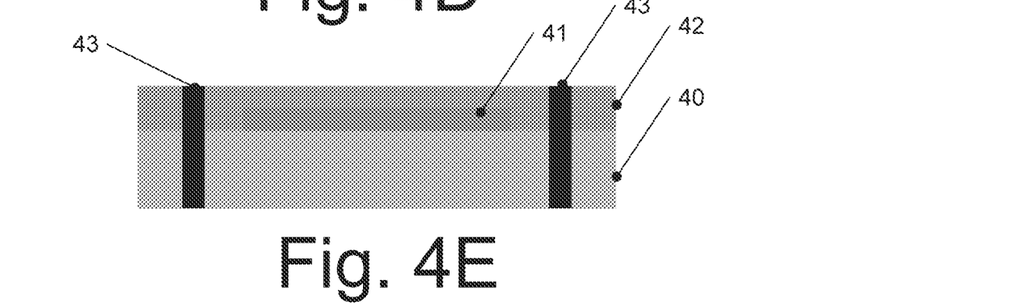
Figure 4F:
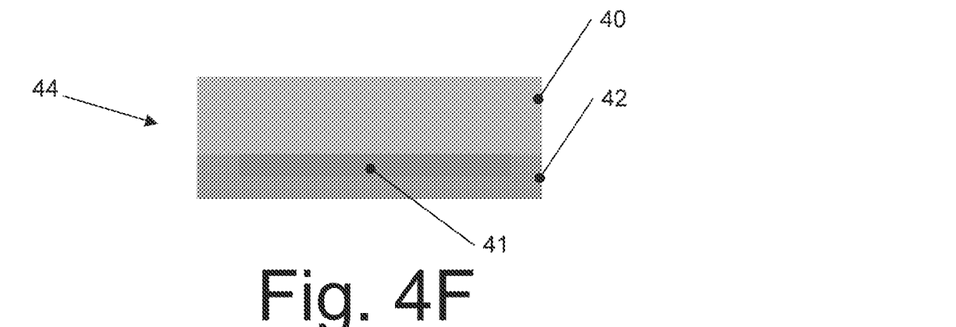

At 34, the method of FIG. 3 comprises a singulation of the LiNbO3 wafer, for example by sawing or etching. This is illustrated in FIG. 4E, where a portion comprising the structured metal layer 41 is singled out along cut lines 43. It should be noted that the provision of a single electrode 41 is only an example, and in embodiments chips comprising a plurality of electrodes for a plurality of resonators may be singulated. The result is shown in FIG. 4F, for a singulated chip 44 (flipped top-side down).

Figure 4G:
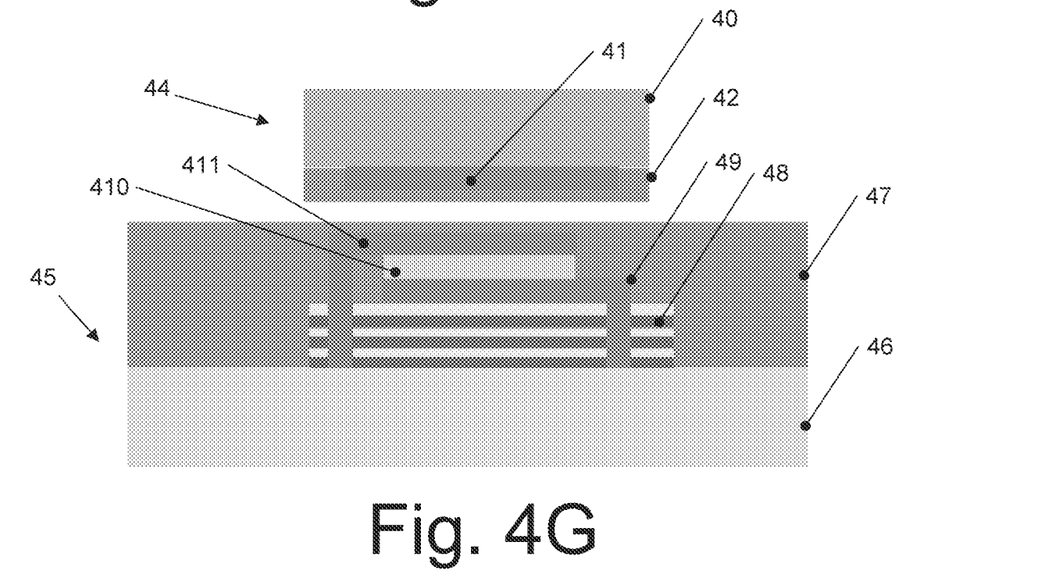

At 35, the method then comprises providing a silicon substrate wafer with a resonator structure processed thereon. An example is shown in FIG. 4G for a processed silicon wafer 45. Processed wafer 45 comprises a silicon substrate wafer 46. On wafer 46, a BAW resonator is formed comprising an acoustic mirror stack 48, for example made of alternating layers of an oxide like silicon dioxide and a metal like tungsten, a bottom electrode 49, a piezoelectric material 410, for example aluminum nitride (AlN) or scandium aluminum nitride (ScAlN), and a top electrode 411. This structure is surrounded by planarized oxide 47. In another embodiment, the layer stack 48 forming the acoustic mirror may also be embedded into silicon wafer 46. Instead of acoustic mirror stack 48, another acoustic termination like a cavity may be provided. Such a cavity may be provided on silicon substrate wafer 46 or in silicon substrate wafer 46 at the side facing singulated chip 44 in FIG. 4G.

The resonator structure of processed wafer 45 serves only as an example, and other conventional BAW resonator structures may also be used.

At 36, the chips of the LiNbO3 wafer generated by singulation are then transferred to the processed silicon wafer and bonded thereto. This is also illustrated in FIG. 4G, where chip 44 is placed above and aligned to processed wafer 45 such that electrode 41 is aligned with the resonator in processed wafer 45 and oxide 42 faces oxide 47.

It should be noted that a plurality of chips 44 may be placed on processed wafer 45 to be aligned with different resonator structured on processed wafer 45 for a production of a plurality of resonator structures or a plurality of devices with resonator structures on a single wafer. In this case, FIG. 4G shows only a part of a larger wafer structure. After the chip transfer onto the Si substrate wafer, the transferred chips are bonded to the substrate wafer by means of a conventional oxide-to-oxide bonding process. For example, by applying heat and pressure, oxide layers 42, 47 bond to form a single oxide layer 413.

Figure 4H:
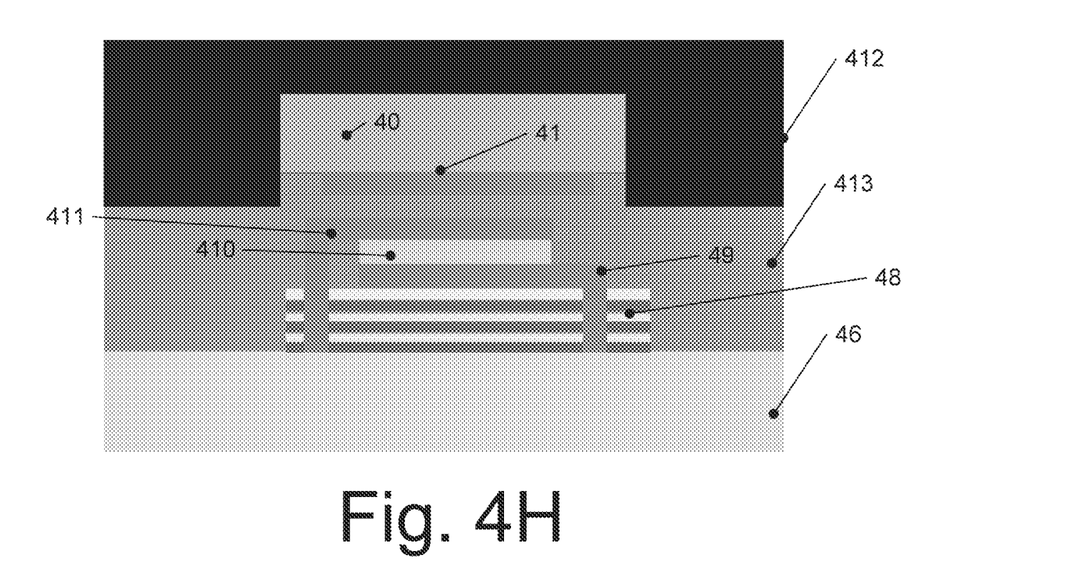
Figure 4I:
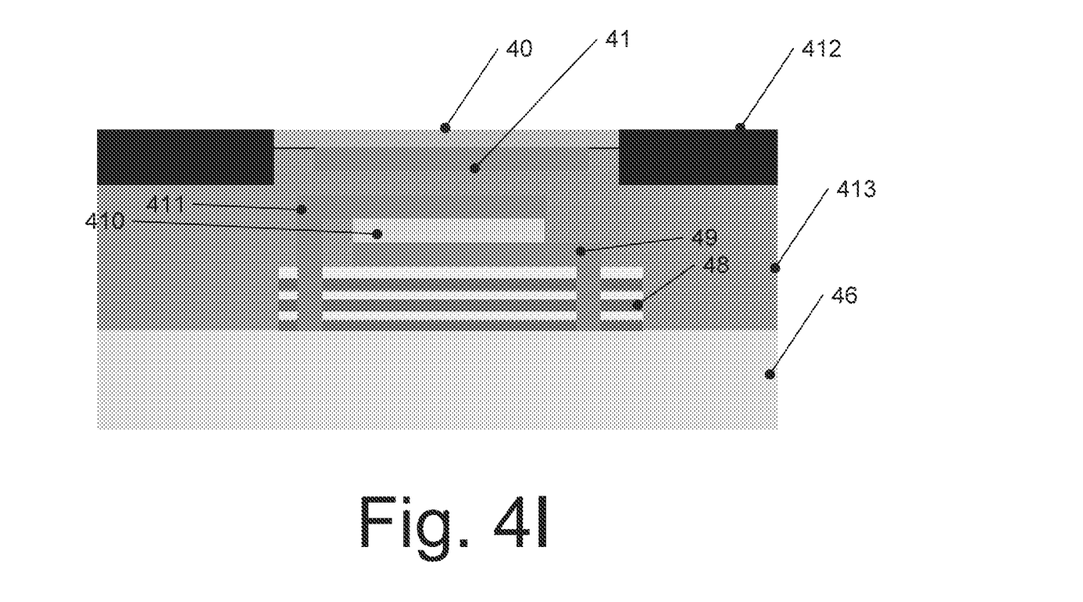

At 37, after the chips 44 are bonded to processed wafer 45, the entire wafer 35 with the bonded chips 44 is then encapsulated for example by a compression molding process. This is illustrated in FIG. 4H, where a numeral 412 in FIG. 4H illustrates a molding material like a plastic mold compound material, which may be provided in liquid form onto the wafer and then pressed in form and cured by the compression molding. Through the molding, acoustic mirror stack 48 or another acoustic termination is encapsulated in the structure.

Next, in the embodiment of FIG. 3 at 38 mechanical grinding is performed to thin the LiNbO3 40 to a layer having a desired thickness. With usual mechanical grinding, an accuracy of about +/−10 µm may be obtained. To increase accuracy, spacers with a well-defined height may serve to stop or slow down the grinding. Two or more different kinds of spacers may be used to provide a multistep grinding process. In some embodiments, a final thickness of the order of 5 to 20 µm may be reached. After single or multi-step grinding, additional thickness correction may be obtained by subsequent wet etching or dry etching or ion milling processes.

Figure 4J:
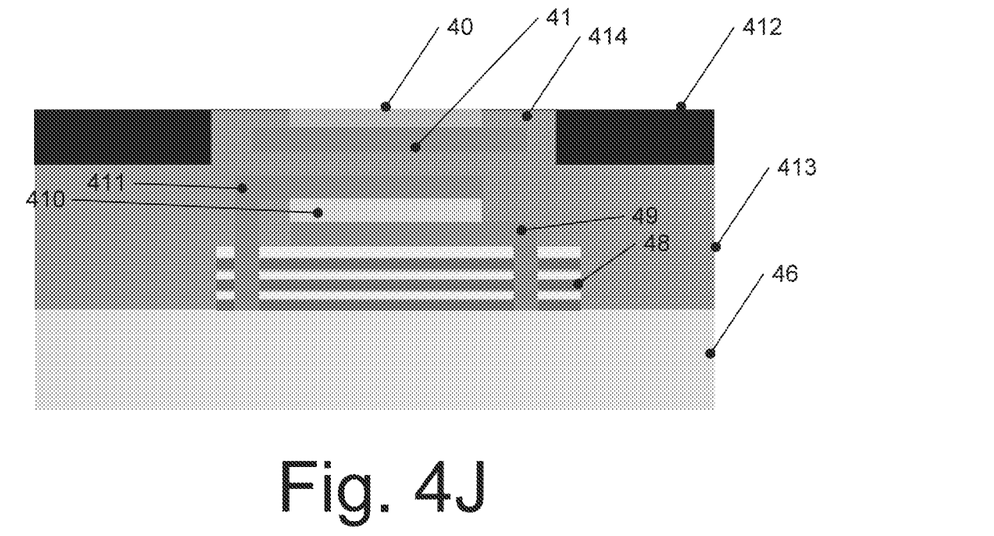
Figure 4K:
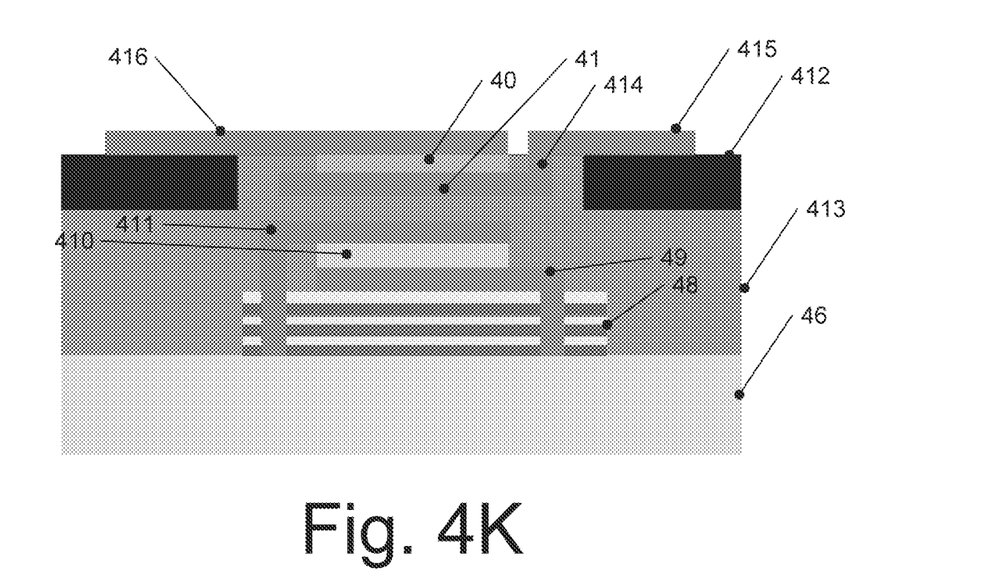

At 39, the method comprises structuring of the LiNbO3 layer, electrode deposition and structuring. This is illustrated in FIGS. 4J and 4K. In FIG. 4J, LiNbO3 layer 40 has been structured (brought to a desired lateral size), gaps have been filled with oxide material 414, for example silicon dioxide, followed by a planarization process (for example CMP process). Additionally, if needed some final thickness adjustments for the LiNbO3 layer may be performed, for example by polishing and etching.

In FIG. 4K, electrode deposition and structuring is shown. A metal layer is deposited and structured to form a top electrode 416 and a connection 415 for the bottom electrode 41, which is electrically coupled to bottom electrode 41 via a vertical interconnect (via) 414.

Figure 4L:
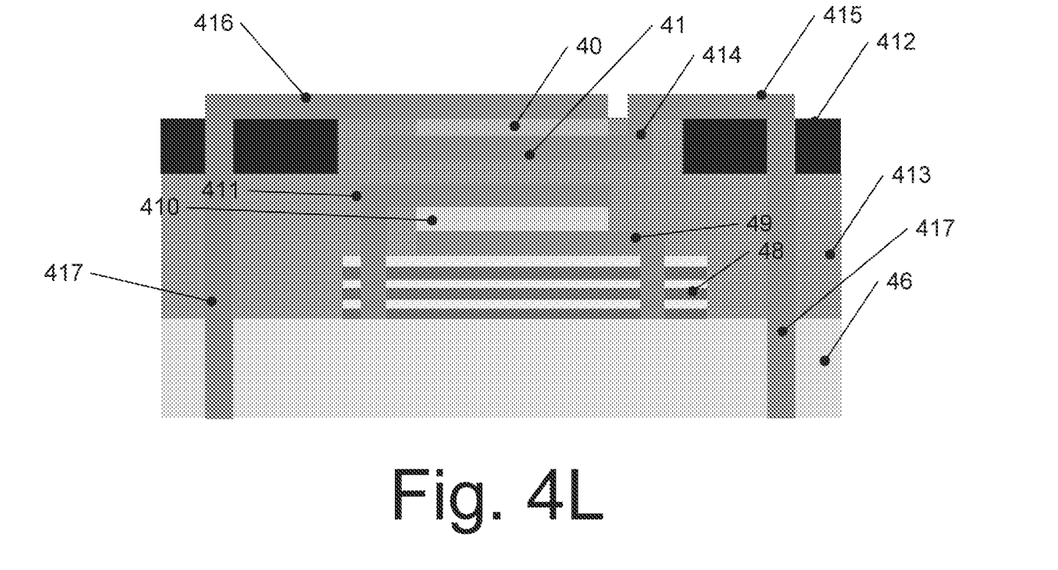
Figure 4M:
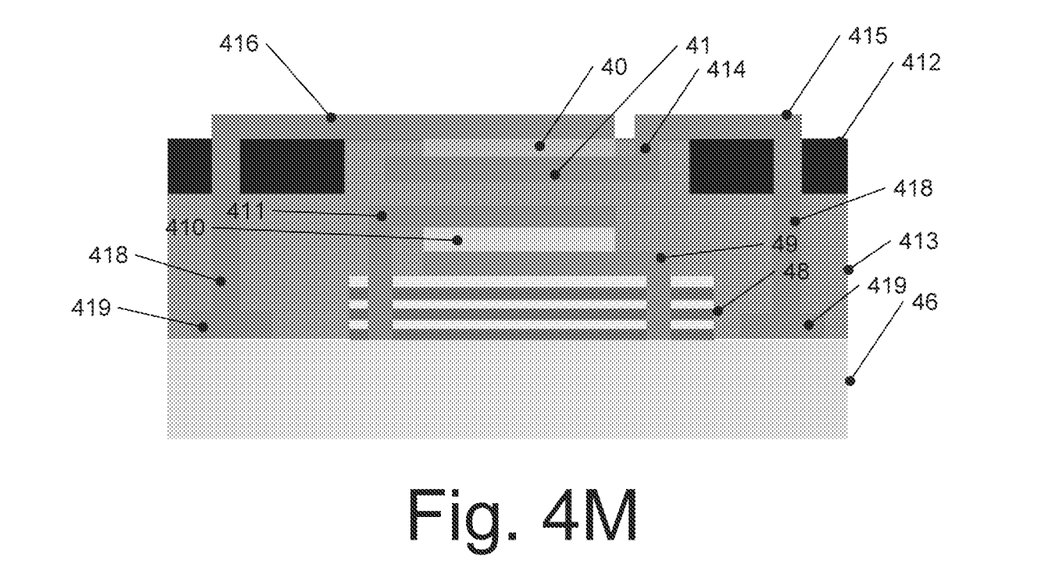

At 310, the method comprises providing connections for the electrode to a desired location. For example, as shown in FIG. 4L, electrodes 416, 415 may be electrically provided to terminals at a backside of wafer 46 via connections 417, or as shown in FIG. 4M to terminals 419 on wafer 46 via connections 418. Such terminals 419 may be interconnects being formed as a part of a metallization layer. Such a metallization layer may be part of circuitry formed on or in wafer 46. The variation of FIG. 4M may for example be employed when wafer 46 has also electronic or electric structures formed thereon which provide signals to electrodes 416, 41 and/or receive signals from them. For example, tuning circuitry to be coupled to electrodes 416, 41 may be provided in case the first resonator formed by LiNbO3 layer 40 sandwiched between electrodes 416, 41 serves as a tuning resonator for tuning a resonance frequency, while a second resonator formed by piezoelectric material 410 and electrodes 49, 411 serves as a filter resonators, with the electrodes connected in a filter structure. In a similar way, electrodes 49 and 411 of the second resonator (on the Si substrate wafer) may be connected to terminals being part of circuitry formed on or in wafer 46 or by means of vias to the wafer frontside or wafer backside.

Substrate wafer 46 may then be diced to form individual devices with parts of wafer 46 serving as substrate.

Just for better illustrating the purpose of resonator structures as discussed previously having two resonators stacked upon each other, operation and application of such resonator structures will now be explained using non-limiting examples referring to FIGS. 5-8.

Figure 5:
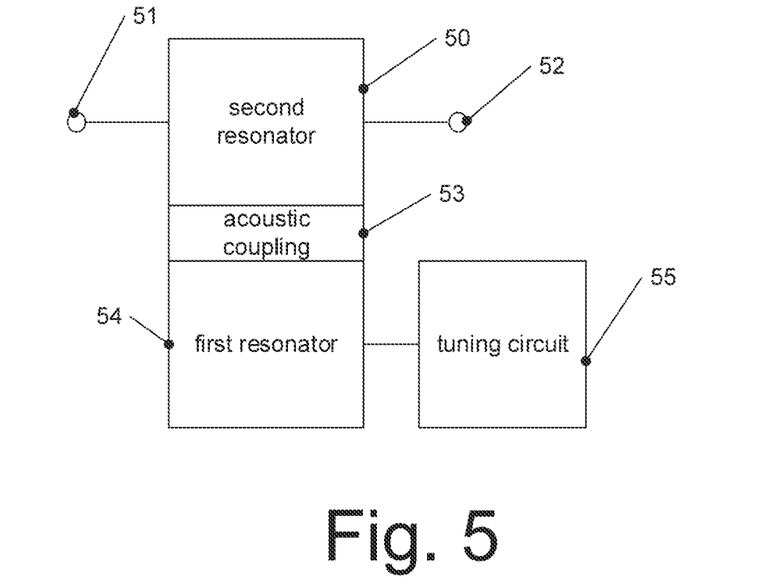
FIGS. 5-9 are diagrams for illustrating operation of coupled resonator structures.

FIG. 5 schematically illustrates a resonator structure as discussed above together with a tuning circuit 55. The resonator structure of the embodiment of FIG. 1 comprises a second resonator 50 that may correspond to the resonator formed in the second wafer, for example a resonator using aluminum nitride (410 in FIG. 4) as a piezoelectric material having a relatively low piezoelectric coupling, allowing for filters having a small bandwidth. Second resonator 50 is coupled with a first resonator 54 via an acoustic coupling 53. First resonator 54 may for example comprise a piezoelectric material having a comparatively high piezoelectric coupling, for example the lithium niobate discussed above (for example 40 in FIG. 4). Acoustic coupling 53 is provided by a material between the first and second resonators, for example the oxide material in FIG. 4. Acoustic coupling means in this context that acoustic waves of second resonator 50 may at least partially propagate to first resonator 54 and vice versa.

Second resonator 50 has a first terminal 51 and a second terminal 52. Using first and second terminals 51, 52 which may for example correspond to or be coupled to electrodes of second resonator 50, the resonator structure of FIG. 5 may be incorporated in a filter structure like a ladder filter structure or a lattice filter structure.

Furthermore, tuning circuit 55 is coupled to first resonator 54. Tuning circuit 55 may comprise an impedance network, which may comprise variable elements like variable impedances, for example a variable capacitor, or switches like radio frequency (RF) switches. By changing a value of the variable element(s) of tuning circuit 55, resonances of the resonator structure of FIG. 5 may be shifted. This may be used for building a tunable filter using one or more filter structures as shown in FIG. 5.

In such an approach with first and second resonators, tuning circuit 55 is electrically decoupled from second resonator 50 and acts on second resonator 50 only via first resonator 54 and acoustic coupling 53. In some embodiments, this avoids adverse effects compared to tuning circuits directly coupled to second resonator 50. Second resonator 50 may also be referred to as a filter resonator, as it is to be incorporated into a filter structure using first and second terminals 51, 52. First resonator 54 may also be referred to as a frequency tuning resonator, as it is used for tuning resonance frequencies of the resonator structure of FIG. 1 using tuning circuit 55.

As mentioned, second resonator 50, acoustic coupling 53 and first resonator 54 may be implemented in a process flow as discussed above.

Figure 6:
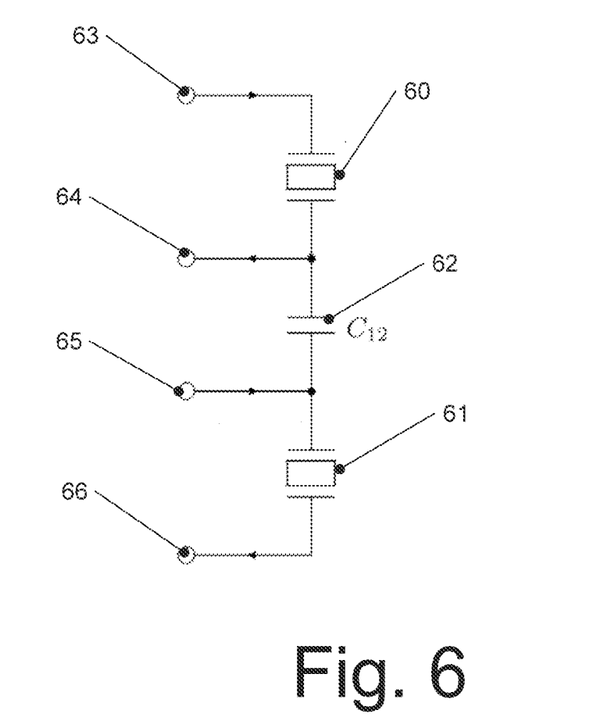

For further illustration, FIG. 6 illustrates an equivalent circuit of the resonator structures discussed above. Numeral 60 denotes a second resonator, formed for example in FIG. 4 by electrodes 411, 49 and piezoelectric material 410. Numeral 61 denotes the first resonator formed for example by electrodes 416, 41 and piezoelectric material 40 (lithium niobate in the example of FIG. 4) in FIG. 6. Terminals 63, 64 contact the electrodes of second resonator 60, and terminals 65, 66 contact the electrodes of first resonator 61. A parasitic capacitor 62 with a capacitance C12 represents the dielectric material between both resonators, for example oxide material 42, 47 or 413 in FIG. 4. In embodiments, terminals 63, 64 then serve to incorporate the resonator structure of FIG. 6 into a filter structure. To provide frequency tuning, a tuning circuit may be coupled to terminals 65 and 66.

Figure 7:
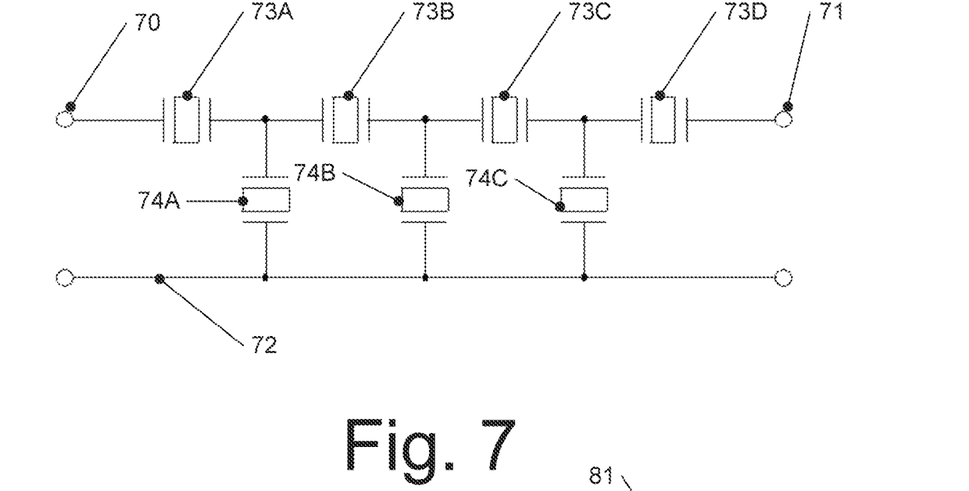

FIG. 7 illustrates an example topology of a ladder filter, in this case a 3½ stage ladder filter. Numeral 70 denotes a signal input, numeral 71 denotes a signal output and numeral 72 denotes ground. The ladder filter of FIG. 7 comprises four series resonators 73A to 73D and three shunt resonators 74A to 74C. Typically all series resonators 73A to 73D have the same resonance frequencies, and all shunt resonators 74A to 74C have the same resonance frequencies, but the resonance frequencies of the series and the shunt resonators are detuned with respect to each other. The amount of detuning roughly corresponds to the bandwidth of the individual resonators or to half the bandwidth of the resulting filters. The resonance frequencies of the shunt resonators 74A to 74C in typical cases are lower than the resonance frequencies of the series resonators 73A to 73D.

Each of resonators 73A to 73D, 74A to 74C may be a first resonator of a resonator structure as discussed previously with respect to FIGS. 1-6. Via a tuning circuit coupled to the respective second resonators of the resonator structures, frequency tuning of the filter may be performed. The ladder filter structure of FIG. 7 serves only as an example, and any conventional ladder or lattice filter structures used with BAW resonators in the art may be used and modified by replacing resonators conventionally used by resonator structures comprising first and second resonators as explained with reference to FIGS. 1-6. A plurality of such filters may be combined to form an n-port filter structure, for example for filtering a plurality of frequency bands used in communication applications.

Figure 8:
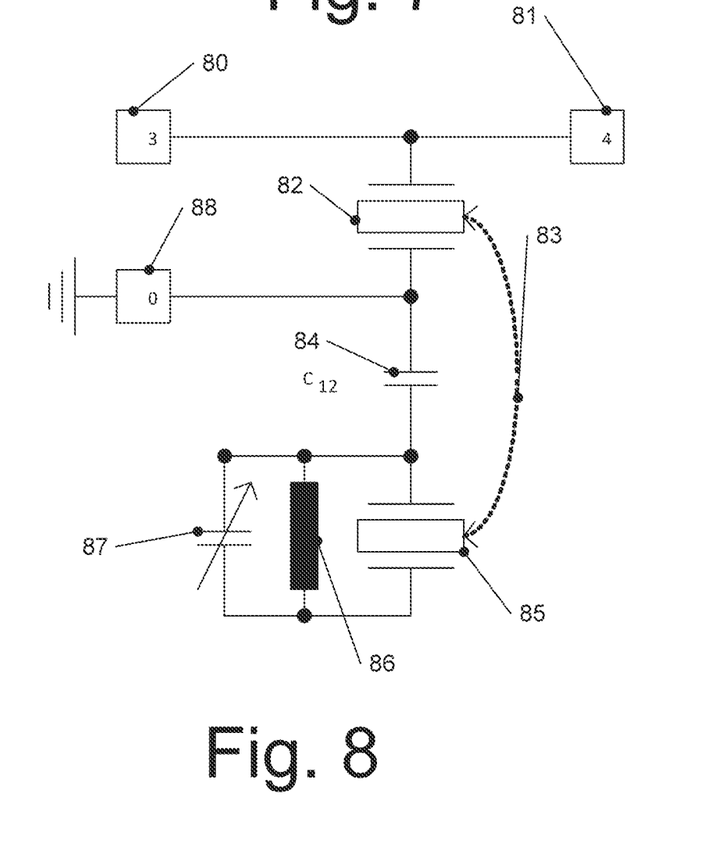

FIG. 8 illustrates a resonator structure according to an embodiment comprising a tuning circuit and usable as shunt resonator element, for example to implement shunt resonators 74A to 74C of the ladder filter structure of FIG. 7.

The resonator structure of FIG. 8 comprises a first resonator 85 and a second resonator 82. First resonator 85 and second resonator 82 are electrically isolated (but not acoustically decoupled) e.g. by a dielectric material represented by a parasitic capacitor 84 with capacitance C12. This dielectric material provides an acoustic coupling between the resonators 82, 85 as indicated by an arrow 83. Implementation of first resonator 85 and second resonator 82 may be as explained previously with respect to FIGS. 1-6.

One electrode of the second resonator 82 is connected to ground (e.g. 88 in FIG. 8), whereas the other electrode is connected to terminals 80 and 81. Terminals 80, 81 serve for connection with further resonators or signal input/output terminals to build filter structures. For example, when the shunt resonator element of FIG. 6 is used for implementing the shunt resonator 74A of FIG. 7, first terminal 80 is connected with series resonator 73A and second terminal 81 is connected with series resonator 73B.

In the example filter structure of FIG. 7, the ground connection 88 in FIG. 8 corresponds to the coupling of any one of shunt resonators 74A to 74C to ground line 72.

Furthermore, a tuning circuit is coupled between the electrodes of first resonator 85. In the example of FIG. 8, the tuning circuit comprises a variable capacitor 87 coupled in parallel to an inductance 86. Inductance 86 in some embodiments may be implemented as a high Q (Quality-factor) inductor or other reactance, e.g. having a Q-factor of more than 10, more than 50 or more than 100. An inductivity L1 of the inductor may for example be between 0.5 and 200 nH, for example below 50 nH, e.g. between 1 and 10 nH. Variable capacitor 87 may be implemented in any conventional manner using for example varactors or switched capacitors. By changing the capacitance value of variable capacitor 87, resonances (series resonance and parallel resonance) of the resonator element of FIG. 8 may be tuned. The tuning circuit of FIG. 8 is only an example, and various combinations of capacitances, inductors and/or resistors may be used, one or more of these capacitances, inductors and/or resistors being variable to provide a tuning. In some embodiments, the tuning circuit may also comprise switches like radio frequency (RF) switches that may be selectively opened and closed to tune the resonator element. In such tuning circuits, capacitances or inductivities may be connected in series or parallel to the switch or switches, (e.g. RF switch or switches).

An inductance 86, e.g. an inductor, may increase a tuning range compared to a case where only a variable capacitor is used.

Figure 9:
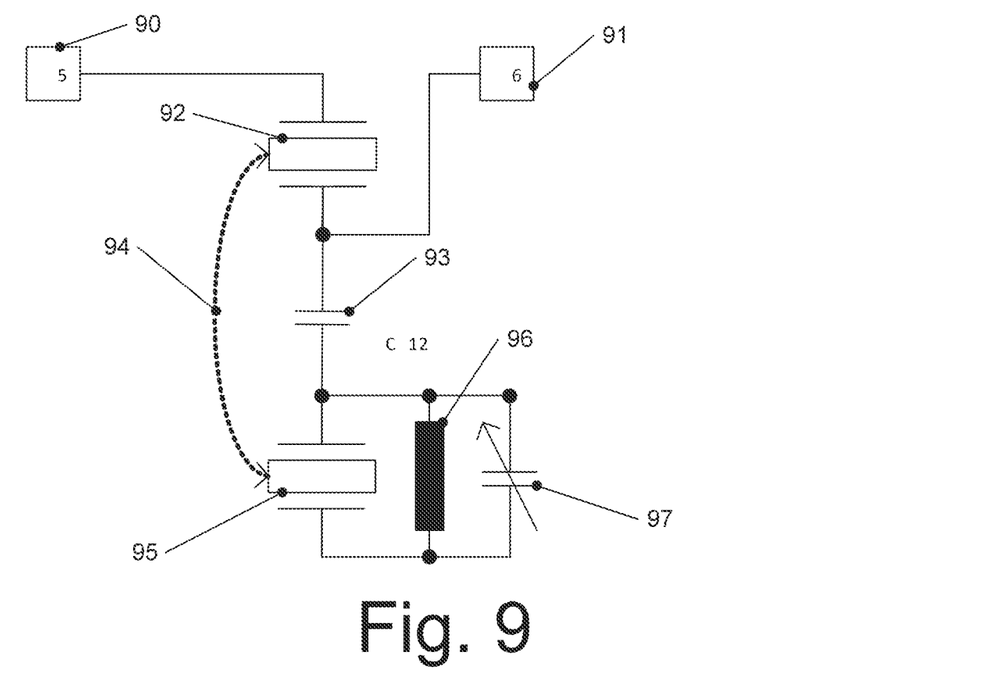

FIG. 9 is a circuit diagram of a resonator element suitable as a series resonator in filter structures like the filter structure of FIG. 7, for example for implementing series resonators 73A to 73D. The resonator element of FIG. 9 comprises a first resonator 95 and a second resonator 92 which are electrically separated as indicated by a (parasitic) capacitance 93, having a capacitance value C12. Capacitance 93 is associated with some dielectric layer(s) that acoustically couples the first resonator 95 and the second resonator 92, as indicated by an arrow 94. First and second resonators 95 and 92 may be implemented as explained with reference to FIGS. 1-6 above.

The electrodes of second resonator 92 are coupled with a first terminal 90 and a second terminal 91, respectively. Via first and second terminals 90, 91, the resonator element of FIG. 9 may be incorporated in a filter structure. For example, to implement series resonator 73A of FIG. 7, first terminal 90 would be coupled to signal input 70, and second terminal 91 would be coupled to resonators 74A and 73B. In case resonator 74A is implemented as in FIG. 7, for example second terminal 91 of FIG. 9 would be coupled with first terminal 80 of FIG. 8, and second terminal 81 of FIG. 8 would then be coupled with a corresponding terminal 90 of resonator 73B.

Furthermore, a tuning circuit is coupled to the electrodes of first resonator 95 comprising for example an inductance 96 and a variable capacitor 97. Inductance 96 and variable capacitance 97 may be implemented in a similar manner as explained for inductance 86 and variable capacitance 87 of FIG. 8, respectively. Furthermore, inductance 96 and capacitance 97 are merely one example for a tuning circuit coupled to first resonator 95, and as also explained for FIG. 8 other tuning circuit configurations are also possible.

With the shunt resonator element of FIG. 8 and the series resonator element of FIG. 9, various filter structures like lattice filters and ladder filters, for example the ladder filter structure of FIG. 7, may be built.

It should be noted that the above filter structures and explanations only serve for further illustrating applications of the resonator structures discussed referring to FIGS. 1-6, but are not to be construed as limiting in any way.

Above, methods for manufacturing coupled resonator structures have been discussed. In other embodiments, techniques as discussed above, in particular the singulating of a wafer made of a piezoelectric material followed by a bonding of one or more singulated pieces to another wafer, may be used to manufacture single resonator structures. In this way, for example a LiNbO3-based resonator may be integrated in a silicon environment, where for example an acoustic termination is provided in or on a silicon wafer as discussed above.

Figure 10:
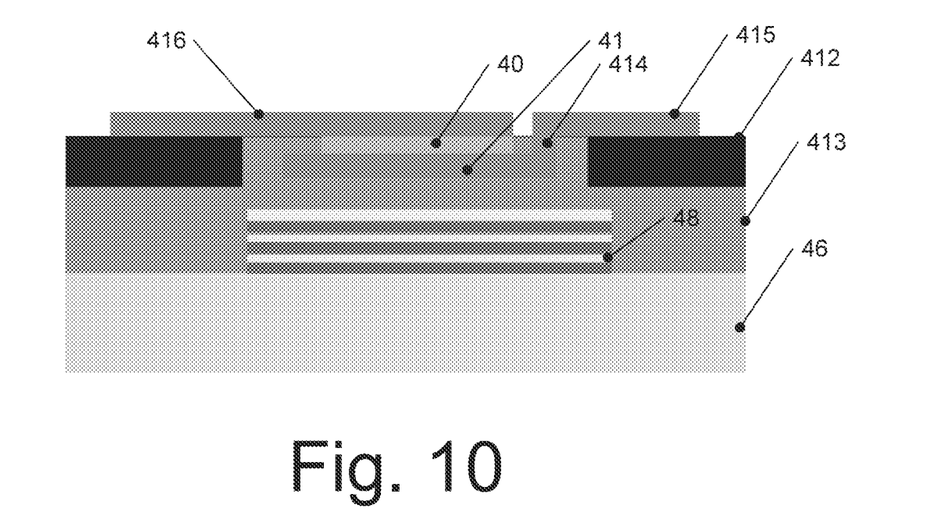
FIG. 10 is a cross-sectional view of a device in a stage of processing according to another embodiment.

For such a manufacturing, the same process flow as discussed above may be used, where only the formation of a resonator in the second wafer is omitted. To illustrate this, FIG. 10 shows a cross-sectional view corresponding to FIG. 4K for such a process. Compared to FIG. 4K, in FIG. 10 electrodes 49, 411 and piezoelectric material 410 are not provided, resulting in a single resonator structure. Apart from this difference, all variations and details discussed for manufacturing of coupled resonator structures may also be applied to the manufacturing of single resonator structures. In this case, oxide layer 413 between layer stack 48 and bottom electrode 414 becomes a part of the acoustic mirror, and in embodiments is taken into account for the design of the individual layer thicknesses of the acoustic mirror.

At least some embodiments are defined by the examples given below:

Example 1

A method for manufacturing a coupled resonator structure, comprising:

processing a first wafer to form a processed first wafer, the processed first wafer comprising a first piezoelectric material, processing a second wafer to form a processed second wafer, the processed second wafer comprising a second piezoelectric material, singulating the first wafer to form at least one singulated wafer chip, bonding the at least one singulated wafer chip to the second wafer to form a joint wafer, and processing the joint wafer to form a resonator structure comprising a first resonator including the first piezoelectric material and a second resonator including the second piezoelectric material such that the first and second resonators are acoustically coupled with each other.

Example 2

The method of example 1, wherein processing the second wafer comprises forming the second resonator on the second wafer.

Example 3

The method of example 1, wherein the second piezoelectric material comprises at least one of aluminum nitride or scandium aluminum nitride.

Example 4

The method of example 1, wherein the second piezoelectric material has a lower piezoelectric coupling constant than the first piezoelectric material.

Example 5

The method of example 1, wherein the processed second wafer comprises an acoustic termination at a first side thereof, wherein said bonding is performed such that the first side of the second wafer faces the singulated wafer chip.

Example 6

A method for manufacturing a resonator structure, comprising:
processing a first wafer to form a processed first wafer, the processed first wafer comprising a first piezoelectric material,
processing a second wafer to form a processed second wafer, the processed second wafer comprising an acoustic termination at a first side thereof,
singulating the first wafer to form at least one singulated wafer chip,
bonding the at least one singulated wafer chip to the second wafer such that the first side of the second wafer faces the singulated wafer chip to form a joint wafer, and
processing the joint wafer to form a resonator structure comprising a first resonator including the first piezoelectric material.

Example 7

The method of example 6, wherein said acoustic termination comprises at least one of a cavity or an acoustic mirror.

Example 8

The method of example 6, wherein the acoustic termination is encapsulated in the resonator structure.

Example 9

The method of example 1, wherein the first wafer is made of the first piezoelectric material.

Example 10

The method of example 1, wherein the first piezoelectric material is monocrystalline.

Example 11

The method of example 1, wherein processing the first wafer comprises depositing a conductive material on the first wafer, at least part of the conductive material forming an electrode of the first resonator.

Example 12

The method of example 11, further comprising structuring the conductive material.

Example 13

The method of example 1, wherein the first piezoelectric material comprises at least one of lithium niobate or lithium tantalate.

Example 14

The method of example 1, wherein processing the first wafer comprises providing a first dielectric layer on the first wafer, and wherein processing the second wafer comprises providing a second dielectric layer on the second wafer, wherein said bonding comprises bonding the first and second dielectric layers.

Example 15

The method of example 14, wherein said first and second dielectric layers comprise an oxide.

Example 16

The method of example 1, further comprising encapsulating the joint wafer.

Example 17

The method of example 1, wherein said processing of the joint wafer comprises thinning the first piezoelectric layer.

Example 18

The method of example 1, wherein said processing of the joint wafer comprises at least one of electrode deposition, electrode structuring or providing electrode connections.

Example 19

A resonator structure, comprising:
a diced first wafer piece comprising a first piezoelectric material,
a substrate comprising an acoustic termination at a first side thereof, wherein the diced wafer piece is bonded to the second wafer such that the first side faces the diced wafer piece.

Example 20

The resonator structure of example 19, wherein the resonator structure is manufactured by the method of example 1.

The invention claimed is:

1. A method for manufacturing a coupled resonator structure, comprising:
processing a first wafer to form a processed first wafer comprising a first piezoelectric material;
processing a second wafer to form a processed second wafer comprising a second piezoelectric material, wherein the second piezoelectric material has a lower piezoelectric coupling constant then the first piezoelectric material;
singulating the first wafer to form at least one singulated wafer chip;

bonding the at least one singulated wafer chip to the second wafer to form a joint wafer; and
processing the joint wafer to form a resonator structure comprising a first resonator including the first piezoelectric material and a second resonator including the second piezoelectric material such that the first and second resonators are acoustically coupled with each other.

2. The method of claim 1, wherein the processing the second wafer comprises forming the second resonator on the second wafer.

3. The method of claim 1, wherein the second piezoelectric material comprises aluminum nitride or scandium aluminum nitride.

4. A resonator structure, comprising:
a diced first wafer piece comprising a first piezoelectric material; and
a substrate comprising an acoustic termination at a first side thereof,
wherein the diced first wafer piece is bonded to a second wafer piece comprising a second piezoelectric material having a lower piezoelectric coupling constant than the first piezoelectric material, such that the first side of the substrate faces the diced first wafer piece.

5. The method of claim 1, wherein the processed second wafer comprises an acoustic termination at a first side thereof, and the bonding is performed such that the first side of the second wafer faces the singulated wafer chip.

6. A method for manufacturing a resonator structure, comprising:
processing a first wafer to form a processed first wafer comprising a first piezoelectric material, wherein the processing the first wafer comprises providing a first dielectric layer on the first wafer;
processing a second wafer to form a processed second wafer comprising an acoustic termination at a first side thereof, wherein the processing the second wafer comprises providing a second dielectric layer on the second wafer;
singulating the first wafer to form at least one singulated wafer chip;
bonding the at least one singulated wafer chip to the second wafer such that the first side of the second wafer faces the singulated wafer chip to form a joint wafer, wherein the bonding comprises bonding the first and second dielectric layers; and
processing the joint wafer to form a resonator structure comprising a first resonator including the first piezoelectric material.

7. The method of claim 6, wherein the acoustic termination comprises a cavity or an acoustic mirror.

8. The method of claim 6, wherein the acoustic termination is encapsulated in the resonator structure.

9. The method of claim 1, wherein the first wafer is made of the first piezoelectric material.

10. The method of claim 1, wherein the first piezoelectric material is monocrystalline.

11. The method of claim 1, wherein the processing the first wafer comprises depositing a conductive material on the first wafer, at least part of the conductive material forming an electrode of the first resonator.

12. The method of claim 11, further comprising structuring the conductive material.

13. The method of claim 1, wherein the first piezoelectric material comprises lithium niobate or lithium tantalate.

14. The method of claim 1, wherein the processing of the joint wafer comprises electrode deposition, electrode structuring or providing electrode connections.

15. The method of claim 6, wherein the first and second dielectric layers comprise an oxide.

16. The method of claim 1, further comprising encapsulating the joint wafer.

17. The method of claim 1, wherein the processing of the joint wafer comprises thinning the first piezoelectric layer.

* * * * *